United States Patent [19]
Patel

[11] Patent Number: 4,560,422
[45] Date of Patent: Dec. 24, 1985

[54] METHOD FOR FORMING INTEGRATED CIRCUITS BEARING POLYSILICON OF REDUCED RESISTANCE

[75] Inventor: Vipin N. Patel, Wyomissing, Pa.

[73] Assignee: Harris Corporation, Melbourne, Fla.

[21] Appl. No.: 623,073

[22] Filed: Jun. 21, 1984

Related U.S. Application Data

[62] Division of Ser. No. 447,287, Dec. 6, 1982, Pat. No. 4,475,955.

[51] Int. Cl.$^4$ ............................................. H01L 29/72
[52] U.S. Cl. ..................................... 148/33; 148/33.3; 148/1.5; 428/620
[58] Field of Search .................... 148/33, 33.3, 33.4, 148/1.5; 428/620; 357/49, 22, 51; 29/576 B, 576 W

[56] References Cited

U.S. PATENT DOCUMENTS

| | | | |
|---|---|---|---|
| 3,953,255 | 4/1976 | Combs, Jr. | 148/187 |
| 4,287,526 | 9/1981 | Sakuma | 357/22 |
| 4,292,091 | 9/1981 | Togei | 148/15 |
| 4,393,573 | 7/1983 | Kato et al. | 29/576 W |
| 4,475,955 | 10/1984 | Patel | 29/576 B |

*Primary Examiner*—Brian E. Hearn
*Assistant Examiner*—Hunter L. Auyang
*Attorney, Agent, or Firm*—Barnes & Thornburg

[57] ABSTRACT

A method for fabricating polysilicon of reduced resistance that may be incorporated in silicon integrated chip manufacturing processes which comprises coating a wafer bearing dielectrically isolated islands with an isolating layer, and depositing thereover a layer of polysilicon. On the surface of the polysilicon layer, a masking layer is formed, and coated with a metallic reflective layer. The portion of the reflective layer, and, optionally, the masking layer, overlaying the interisland area is removed, and the wafer is then exposed to a laser beam, transforming the polysilicon layer into the appropriate resistor material. The remaining metallic and/or masking layer may then be removed, the device exposed to a laser beam again, thereby transforming the polysilicon across the entire surface.

5 Claims, 6 Drawing Figures

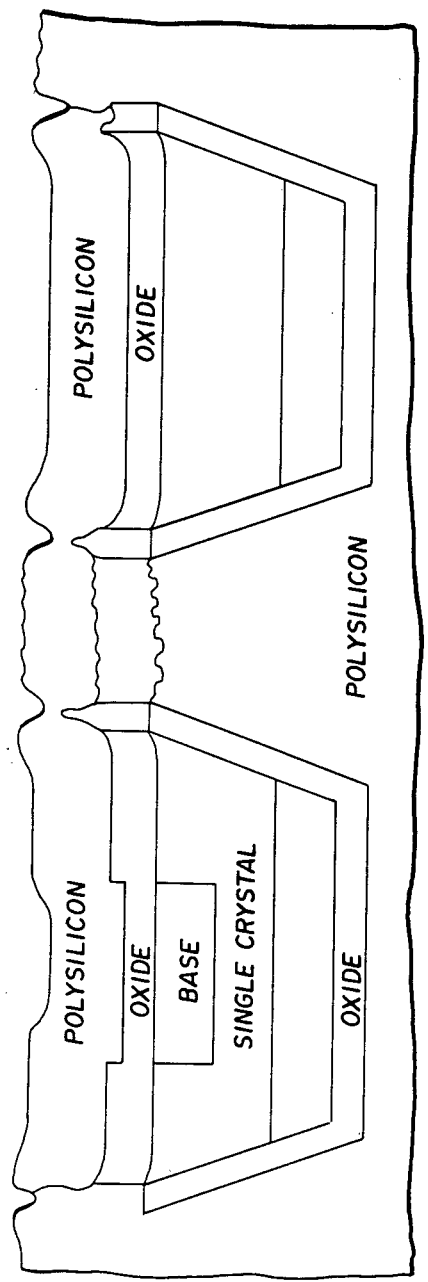
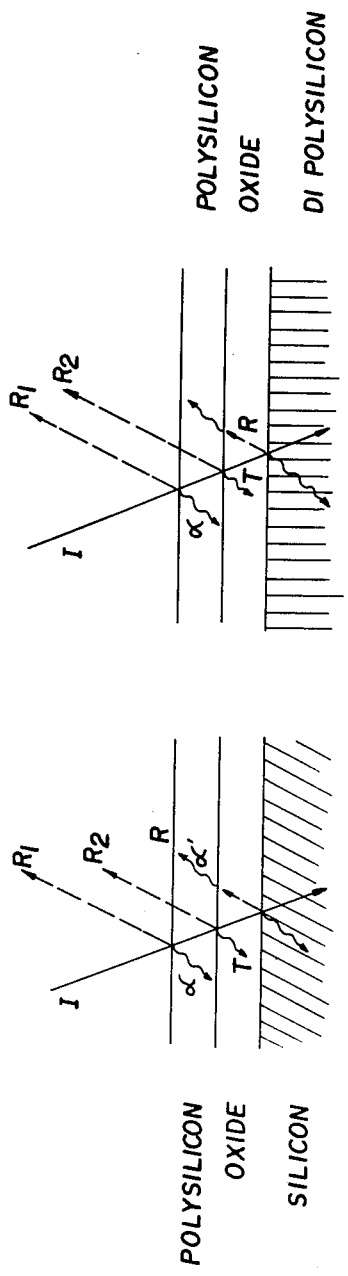
FIG.1
FIG.2
FIG.3

METHOD FOR FORMING INTEGRATED CIRCUITS BEARING POLYSILICON OF REDUCED RESISTANCE

This is a divisional of application Ser. No. 447,287, filed Dec. 6, 1982, now U.S. Pat. No. 4,475,955.

BACKGROUND OF THE INVENTION

Polysilicon of lowered resistance plays an increasingly important role in silicon integrated circuit technology, as, e.g., resistors and conductors. Polysilicon resistors are finding increasing application in RAMs and PROMs, as well as in logic circuits. The same resistors are employed for current limiting in CMOS circuits, as well as in precision DAC-ADC for resistor networks.

Typically, elements of polysilicon of lowered resistance, such as polysilicon resistors, or other active semiconductor elements such as diodes and transistors, are formed through a polysilicon deposition/annealing process, which includes a first oxide layer deposition process to isolate the starting material on which the polysilicon resistor is to be formed. Over the isolating oxide layer a polysilicon layer is deposited, for example, by low pressure chemical vapor deposition (LPCVD) techniques. Impurities are introduced into the polysilicon so deposited through doping by diffusion or implantation, and subsequently annealed. Thereafter, standard integrated circuit contact processing is effected to complete the polysilicon resistor device.

However, resistors formed by these prior art methods are unsatisfactory due to a number of defects. Particularly, the tolerance in such resistors is difficult to control. This is due, in part, to variation in grain size in the polysilicon, and in part to undesired diffusion of the doped or implanted impurities in the polysilicon. These prior art resistors are also characterized in that they exhibit a large, negative temperature coefficient of resistance (TCR) and voltage coefficient of resistance (VCR).

In an attempt to overcome and avoid these defects, processes employing laser beams or similar high energy beams to anneal the deposited polysilicon have been followed. These processes are generally identical to the prior art processes described above up to the deposition of polysilicon over the oxide isolation layer deposited. The polysilicon is then annealed through laser irradiation, or irradiation by a similar high energy beam. Thereafter, the irradiated polysilicon is implanted with dopant, the implant annealed and standard contact processing followed to produce the finished device. Laser irradiation through these processes has allowed excellent control over resistor parameters and improved the TCR and VCR for laser annealed polysilicon resistors.

In order to incorporate the laser annealed resistor process in the silicon integrated chip manufacturing process, for instance, a chip comprising a dielectrically isolated high frequency bipolar circuit, formation of the resistor after the formation of the dielectrically isolated islands making up the circuit is necessary.

Unfortunately, when using the laser annealing process that is described above, a polysilicon resistor cannot be satisfactorily formed over the interisland areas, which is highly desirable to increase circuit density. A polysilicon LPCVD layer is formed over the isolating oxide layer overlying the isolated islands. The polysilicon is then irradiated. However, owing to different laser beam absorption characteristics in the layers underlying the polysilicon film, the polysilicon recrystallizes only over the dielectrically isolated islands, but not over the polycrystalline interisland areas, where recrystallization is also desired. This prevents fabrication of the resistors over the interisland areas.

These absorption characteristics, and the problem encountered in forming polysilicon of lowered resistance, may be better understood with reference to FIGS. 1-3. FIG. 1 is a cross-sectional representation of a semiconductor device bearing a polysilicon thin film. FIG. 2 is a representation of the reflective characteristics over the dielectrically isolated islands of FIG. 1, while FIG. 3 is of the interisland area.

As can be seen by comparing FIGS. 2 and 3, the reflection R of irradiating, high energy beams over the dielectrically isolated islands is much greater than that over the polycrystalline support of the interisland area thereby defining regions of higher and lower high energy reflection characteristics, respectively. Accordingly there is more energy for recrystallization of the deposited polysilicon over the dielectrically isolated island than over the interisland areas. This reflective differential is so great that to recrystallize the polysilicon over the interisland area would require irradiation of such magnitude as to destroy the dielectrically isolated islands exposed thereto. Accordingly, formation of polysilicon of lowered resistance over the interisland areas has been difficult, if not impossible, to achieve in an integrated process, thus sacrificing circuit density.

Although a polycrystalline support bearing dielectrically isolated islands has been used as an example, it will be apparent that the same obstacle will be encountered whenever it is desired to form a layer of laser-annealed polysilicon over a substrate having regions of lower and higher high energy reflection characteristics.

Accordingly, one object of this invention is to incorporate a method for forming polysilicon of lowered resistance in the silicon integrated chip manufacturing process.

Another object of this invention is to provide a process whereby laser annealed polysilicon may be fabricated in the interisland area between dielectrically isolated islands.

Yet another object of this invention is a method which allows the formation of integrated circuit devices of improved circuit density.

A further object of this invention is to provide a method whereby resistors of improved tolerance, TCR and VCR may be fabricated directly on a silicon integrated chip.

Still another object of this invention is to provide a method whereby a dielectrically isolated high frequency bipolar circuit may be formed.

Yet a further object of this invention is to provide a method for formation of laser annealed polysilicon which may be used in the fabrication of active semiconductor devices.

SUMMARY OF THE INVENTION

The invention consists of a process which comprises the deposition of an oxide isolation layer over a precursor starting material which may consist of a silicon chip bearing dielectrically isolated islands. A layer of polysilicon is deposited thereover, preferably through LPCVD processes, and a second layer of oxide, or a nitride layer, is grown or deposited thereover. Superimposed on this second oxide, or nitride, layer is a layer of metallic reflecting material.

Using conventional photo-resist lithographic techniques, the metallic reflecting layer, and optionally the underlying oxide or nitride layer, is etched away over the area between the islands of the starting material.

The surface of the layer so formed is irradiated with a high energy beam, such as a laser beam, the beam being reflected by the metallic reflecting layer overlaying the dielectrically isolated islands, while the exposed polysilicon between the islands is modified by the laser beam irradiation.

Subsequently, the metallic and/or oxide/nitride layers overlaying the dielectrically isolated islands may be removed and the exposed surface irradiated to modify the polysilicon in these areas as well.

Thereafter, any remaining masking layers are removed and the chip fabrication process is completed using standard IC processes.

BRIEF DESCRIPTION OF THE DRAWINGS

FIG. 1 is a representational cross-sectional view of a conventional integrated circuit chip precursor.

FIG. 2 is a schematic illustration of the energy beam reflectance profile of the chip of FIG. 1 for a dielectrically insulated island area.

FIG. 3 is a schematic illustration of the energy beam reflectance profile of the chip of FIG. 1 for an interisland area.

DETAILED DESCRIPTION OF THE INVENTION

Figure 4:
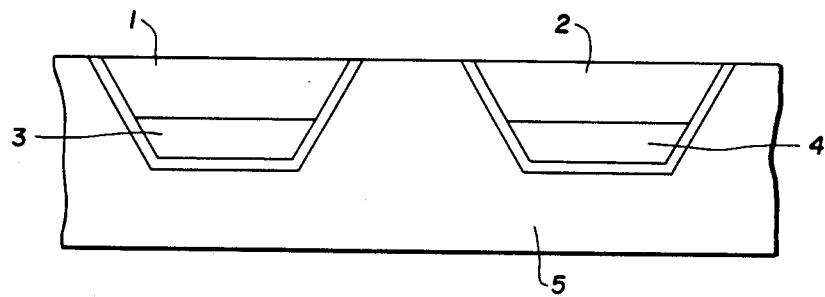
FIG. 4 is a representational cross-sectional view of the substrate bearing dielectrically isolated islands upon which the polysilicon resistor is to be formed.

With specific reference to the drawings described above, FIGS. 4–6 illustrate progressive stages of the IC wafer during the polysilicon resistor formation process of this invention. As illustrated in FIG. 4, the wafer to be provided with a polysilicon resistor bears P island 1 and N island 2, for PNP and NPN transistors on which the LCP resistors are to be fabricated, both islands being dielectrically isolated. As is conventional, these islands overlay P buried layer 3 and N buried layer 4. They are formed on a support wafer 5, generally comprised of polycrystalline silicon.

Figure 5:
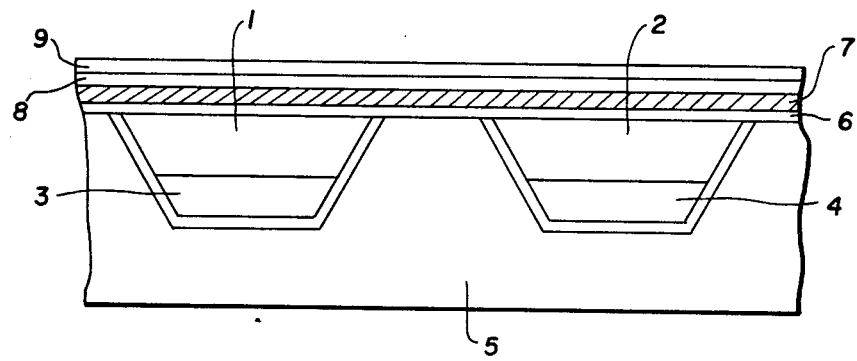
FIG. 5 is a representational cross-sectional view of the substrate after deposition of the polysilicon and masking layers of the claimed process.

As illustrated in FIG. 5, a conventional oxide isolation layer 6 is deposited over islands 1 and 2 and the substrate, extending completely thereover. Over isolation layer 6, an LPCVD polysilicon layer 7 is deposited of a thickness of 1,000–10,000 Angstroms. This layer is conventional, and should be of sufficient depth to form laser annealed polysilicon resistors.

A masking oxide or nitride layer 8 is formed over the polysilicon layer, and may be either grown or deposited thereover. Masking layer 8 is preferably of a thickness 50–10,000 Angstroms.

On the surface of masking layer 8, reflective layer 9 is deposited. The critical characteristic of reflecting layer 9 is that it be able to reflect an irradiating high energy beam such as a laser beam. Preferably, the layer is comprised of a metallic reflecting composition, such as W, Mo, Ta, Ti or Ti-W. A particularly preferred substance for reflecting layer 9 is aluminum. The layer is preferably of a thickness of 1,000–20,000 Angstroms.

Figure 6:
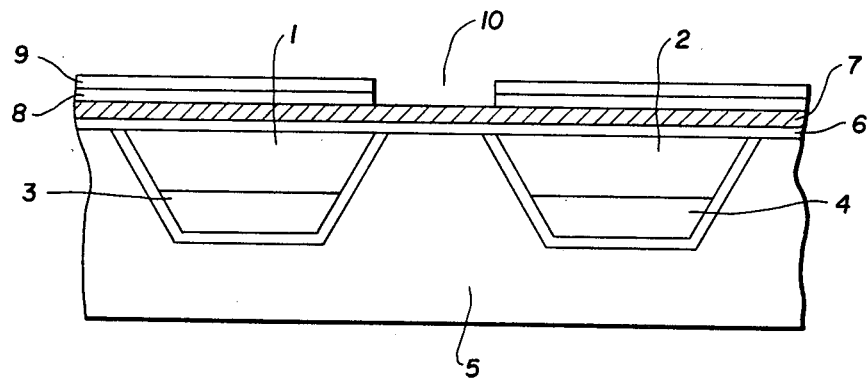
FIG. 6 is a representational cross-sectional view of the IC wafer after etching of the protective layers and in condition for laser irradiation.

As illustrated in FIG. 6, reflective layer 9 and optionally, masking layer 8, are removed in that portion 10 overlaying the interisland area between islands 1 and 2. This removal may be achieved by conventional photoresist/photolithographic processes, in which the areas whose removal is not desired are masked, and the unmasked layers, overlaying the interisland areas, are removed in either a single or multiple etch process. At least that portion of reflecting layer 9 overlaying the interisland areas must be removed. Optionally, the corresponding portion of masking oxide or nitride layer 8 may be similarly removed. Alternatively, one who is skilled in the art may select the thickness of layer 8 such that only the appropriate portion of reflecting layer 9 need be removed.

After removal of the appropriate layers, a laser beam is directed onto the surface of the wafer on which the resistors are to be fabricated. The beam is reflected by metallic reflecting layer 9, over the dielectrically isolated islands, while the polysilicon overlaying the interisland areas exposed to the beam is modified by the laser beam, thereby forming polysilicon of lowered resistance on that portion of the wafer.

Subsequently, the masking layer overlaying the dielectrically isolated islands may be removed, and the newly exposed surface irradiated, to modify the polysilicon there as well.

After irradiation is completed, the chip fabrication process is continued to completion, using standard IC process, after removal of any remaining masking layers deposited generally through conventional etching processes.

Although the present process has been described for totally dielectrically isolated islands with polycrystalline interisland areas and junction isolated bottom surfaces where it is desired to form resistors over the interisland area it will be recognized that the above-disclosed process allows one to fabricate a resistor through a method which may easily and economically be incorporated in widely practiced silicon integrated chip manufacturing processes. In contrast to the processes of the prior art, the instant process allows formation of the desired resistor only in areas where formation is necessary. The resulting semiconductor device offers significant advantages over those produced by prior processes, in that the resistors are of substantially reduced TCR and VCR, allowing for greater simplification and flexibility in circuit design. This is achieved while avoiding the need to interrupt the silicon integrated chip manufacturing processes widely followed in the art.

Although this invention has been described in its preferred embodiment, it is clear that it is susceptible of numerous modifications and embodiments, including variations in the type of element formed, in the substrate, islands and energy source for irradiation, as well as the depth and method of deposition of individual layers, which will occur to those skilled in the art without the exercise of inventive faculty.

What is claimed is:

1. An integrated circuit device precursor, comprising: a substrate having regions of lower and higher energy beam reflection characteristics, wherein said regions of higher energy beam reflection characteristics are dielectrically isolated islands, and said regions of lower energy beam reflection characteristics are interisland areas of polycrystalline silicon positioned therebetween; and a layer of energy beam annealed polysilicon overlaying at least a portion of said regions of lower and higher energy beam reflection characteristics, said layer of energy beam annealed polysilicon being isolated from said regions of lower and higher energy beam reflection characteristics by an isolating layer and wherein said layer of energy beam annealed polysilicon over said regions of lower energy beam reflection characteristics has resistivity suitable for the fabrication of resistors over said interisland areas.

2. The integrated circuit device precursor of claim 1, wherein said energy beam annealed polysilicon is formed by a method comprising the steps of:

forming an isolating layer on the surface of said precursor;

forming a layer of polysilicon on said isolating layer;

depositing a layer of material capable of reflecting high energy beams over said polysilicon layer;

removing a portion of said reflecting material overlaying a region of lower energy beam reflection characteristics; and exposing the precursor to a high energy beam.

3. The integrated circuit device precursor of claim 1, wherein said energy beam annealed polysilicon is formed by a method comprising the steps of:

forming an isolated layer on the surface of said precursor;

forming a layer of polysilicon on said isolating layer;

forming a masking layer on said polysilicon layer;

depositing a layer of material capable of reflecting high energy beams over said masking layer;

removing a portion of said reflective material and said masking layer overlaying a region of lower energy beam reflection characteristics; and exposing the precursor to a high energy beam.

4. An integrated circuit device precursor, comprising: a substrate having regions of lower and higher energy beam reflection characteristics; and a layer of energy beam annealed polysilicon overlaying at least a portion of said regions of lower and higher energy beam reflection characteristics, said layer of energy beam annealed polysilicon being isolated from said regions of lower and higher energy beam reflection characteristics by an isolating layer and wherein said layers of energy beam annealed polysilicon over said regions of lower energy beam reflection characteristics has a resistivity suitable for the fabrication of resistors.

5. The integrated circuit device precursor of claim 4, wherein said energy beam annealed polysilicon is formed by a method comprising the steps of:

forming an isolating layer on the surface of said precursor;

forming a layer of polysilicon on said isolating layer, said polysilicon layer being formed over at least a portion of said regions of lower and higher energy beam reflection characteristics;

selectively exposing a portion of said layer of polysilicon overlaying said region of lower energy beam reflection characteristics to an energy beam a first time; and non-selectively exposing said layer of polysilicon to an energy beam a second time.

* * * * *